(12) United States Patent
Noel et al.

(10) Patent No.: US 9,093,499 B2
(45) Date of Patent: Jul. 28, 2015

(54) INTEGRATED CIRCUIT USING FDSOI TECHNOLOGY, WITH WELL SHARING AND MEANS FOR BIASING OPPOSITELY DOPED GROUND PLANES PRESENT IN A SAME WELL

(71) Applicants: Jean-Philippe Noel, Grenoble (FR); Bastien Giraud, Sanary sur Mer (FR); Olivier Thomas, Revel (FR)

(72) Inventors: Jean-Philippe Noel, Grenoble (FR); Bastien Giraud, Sanary sur Mer (FR); Olivier Thomas, Revel (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 29 days.

(21) Appl. No.: 13/627,059

(22) Filed: Sep. 26, 2012

(65) Prior Publication Data
US 2013/0089978 A1   Apr. 11, 2013

(30) Foreign Application Priority Data
Sep. 26, 2011   (FR) ..................... 11 58544

(51) Int. Cl.
| | |
|---|---|
| H01L 29/66 | (2006.01) |
| H01L 29/786 | (2006.01) |
| H01L 21/768 | (2006.01) |
| H01L 21/84 | (2006.01) |
| H01L 27/12 | (2006.01) |
| H01L 27/092 | (2006.01) |
| H01L 21/8238 | (2006.01) |

(52) U.S. Cl.
CPC .............. *H01L 21/768* (2013.01); *H01L 21/84* (2013.01); *H01L 27/1203* (2013.01); *H01L 29/78609* (2013.01); *H01L 29/78648* (2013.01); *H01L 21/823892* (2013.01); *H01L 27/0928* (2013.01)

(58) Field of Classification Search
CPC .................... H01L 21/84; H01L 29/66772
USPC .............................. 257/347, E29.28
See application file for complete search history.

(56) References Cited

U.S. PATENT DOCUMENTS

| | | | | |
|---|---|---|---|---|
| 6,063,686 A | * | 5/2000 | Masuda et al. | 438/406 |
| 6,100,557 A | * | 8/2000 | Hung et al. | 257/299 |

(Continued)

FOREIGN PATENT DOCUMENTS

WO   2010/112585   10/2010

OTHER PUBLICATIONS

Noel et al., "Multi-VT UTBB FDSOI Device Architectures for Low-Power CMOS Circuit," IEEE Transactions on Electron Devices, IEEE Service Center, vol. 58, No. 8, pp. 2473-2482 (2011).*

*Primary Examiner* — Victor A Mandala
*Assistant Examiner* — Regan J Rundio
(74) *Attorney, Agent, or Firm* — Occhiuti & Rohlicek LLP

(57) ABSTRACT

A manufacture includes an IC comprising a stacking of a semiconducting substrate, a buried insulating layer, and a semiconducting layer, a first electronic component formed in and/or on the semiconductor layer, a bias circuit to generate a first bias voltage, first and second via-type interconnections, to which the bias circuit applies a same bias voltage equal to the first bias voltage, a first insulation trench separating the first electronic component from the first and second interconnections, a first ground plane having a first type of doping, placed beneath the buried insulating layer plumb with the first electronic component, and extending beneath the first insulation trench and up into contact the first interconnection, and a first well having a second type of doping opposite that of the first type, plumb with the first ground plane, and extending beneath the first insulation trench and up into contact with the second interconnection.

13 Claims, 9 Drawing Sheets

(56) References Cited

U.S. PATENT DOCUMENTS

| | | | |
|---|---|---|---|
| 7,259,428 B2 * | 8/2007 | Inaba | 257/347 |
| 2003/0178622 A1 * | 9/2003 | Wei et al. | 257/48 |
| 2007/0063284 A1 | 3/2007 | Kawahara et al. | |
| 2007/0290265 A1 * | 12/2007 | Augusto et al. | 257/351 |

* cited by examiner

INTEGRATED CIRCUIT USING FDSOI TECHNOLOGY, WITH WELL SHARING AND MEANS FOR BIASING OPPOSITELY DOPED GROUND PLANES PRESENT IN A SAME WELL

RELATED APPLICATIONS

Under 35 UC 119, this application claims the benefit of the Sep. 26, 2011 priority date of French application FR 1158544, the contents of which are herein incorporated by reference.

FIELD OF DISCLOSURE

The invention pertains to integrated circuits and especially to integrated circuits on a silicon-on-insulator (SOI) type substrate. SOI technology consists in separating a fine layer of silicon (a few nanometers) from a silicon substrate by a relatively thick (generally some few tens of nanometers thick) layer of insulator.

BACKGROUND

Integrated circuits made with SOI technology have a certain number of advantages. Such circuits generally show lower static and dynamic electricity consumption for equivalent performance, owing to an improved electrostatic control of the channel by the gate. Because there is a non-doped channel, the dispersions of the electrical characteristics are also smaller. Such circuits generally result in lower parasitic capacitances, thus improving switching speed. Furthermore, the latch-up or parasitic triggering phenomenon encountered by MOS transistors in bulk technology can be avoided to the benefit of operating robustness, owing to the presence of the insulating oxide layer. Such circuits therefore prove to be particularly suited to SoC type applications. It is generally noted that SOI integrated circuits are less sensitive to the effects of ionizing radiation and hence prove to be more reliable in applications where such radiation can give rise to operational problems, especially in space applications. SOI integrated circuits can especially include SRAM random-access memories or logic gates. The making of SOI integrated circuits also remains relatively similar to that of bulk technology.

Reducing the static consumption of logic gates while at the same time increasing their switchover speed has been the subject of much research. Certain integrated circuits being developed integrate both low-consumption logic gates and high-switchover-speed logic gates. To generate both these types of logic gates on a same integrated circuit, fast-access logic gates or low-consumption logic gates are chosen from libraries of logic gates. In bulk technology, the threshold voltage level of transistors of a same type is modulated by differentiating their channel doping level. However, in FDSOI (Fully Depleted Silicon-On-Insulator) technology, the doping of the channel is almost zero. Thus, the channel doping level in the transistors cannot show major variations without losing the associated advantages, and this fact makes it impossible to differentiate the threshold voltages by bringing this doping into play. The threshold voltages in non-doped channel FDSOI technology are thus essentially determined by the work function of the gate. A work function slightly below the midgap, known as an N-type work function, for NMOS transistors is generally desired to obtain threshold voltages between 0.2 and 0.5V. Symmetrically, a work function slightly above the midgap, called a P-type work function, for PMOS transistors is generally desired to obtain threshold voltages between −0.2 and −0.5V.

In order to have distinct threshold voltages for different FDSOI technology transistors, there are also known ways of using a biased ground plane placed between an insulating thin-oxide layer and the silicon substrate. By playing on the doping of the ground planes and on their biasing, it is possible to define a range of threshold voltages for the different transistors. We could thus have low-voltage-threshold or LVT transistors, high-voltage-threshold or HVT transistors and medium or standard-voltage-threshold or SVT transistors.

The transistors of an integrated circuit are generally laid out in dual alternating rows of NMOS and PMOS transistors. A row of NMOS transistors is separated from a row of PMOS transistors by an insulation trench. In order to have transistors with different voltage thresholds in a same row, certain transistors are laid out so as to be plumb with an N-type doped ground plane while the other transistors are laid out to be plumb with a P-type doped ground plane.

The US document US2003/178622 (D1) describes an integrated circuit comprising a stacking of a semiconducting substrate, a buried insulating layer and a semiconducting layer. A transistor is formed in and on said semiconducting layer. A bias circuit is configured to generate a first bias voltage. A first via-type interconnection receives the first bias voltage. A first insulation trench separates the transistor from the first interconnection and from a second interconnection in the semiconducting layer. A first well has P-type doping, is placed beneath the buried insulating layer plumb with the transistor and extends beneath the first insulation trench until it makes contact with the first interconnection. A second well has N-type doping and is placed so as to be plumb with the first well and extends beneath the first insulation trench until it makes contact with the second interconnection. The biasing of the first well is variable to modulate the threshold voltage of the transistor. The second well insulates the first well from a P-doped substrate and has a bias greater than that of the first well in order to limit leakages.

It is observed, on the one hand, that the time of diffusion of the bias within a ground plane is relatively long and, on the other hand, that a relatively complex design is needed for the circuit in order to prevent the formation of conductive parasitic diodes between the different doping levels of the semiconductors as a function of the bias that is applied to them. Besides, the formation of contacts with a view to biasing the different types of ground planes proves to be complex and implies the use of a considerable surface area of transition cells to the detriment of integration density.

SUMMARY

The invention seeks to resolve one or more of these drawbacks. The invention thus relates to an integrated circuit comprising a stacking of a semiconducting substrate, a buried insulating layer and a semiconducting layer comprising:
a first electronic component formed in and/or on said semiconducting layer;
a bias circuit configured to generate a first bias voltage;
first and second via-type interconnections, to which the bias circuit applies a same bias voltage equal to the first bias voltage;
at least one first insulation trench separating the first electronic component from the first and second interconnections in the semiconducting layer;
a first ground plane having a first type of doping, placed beneath the buried insulating layer plumb with the first electronic component and extending beneath the first insulation trench up to contact with the first interconnection;

a first well having a second type of doping opposite that of the first type, plumb with the first ground plane and extending beneath the first insulation trench up to contact with the second interconnection.

According to one variant, the circuit furthermore comprises:
- a second electronic component formed in and/or on said semiconducting layer;
- a second ground plane having a second type of doping plumb with the buried insulating layer plumb with the second electronic component, the first well extending up to contact with the second ground plane.

According to yet another variant, said first well has a junction with the first type of doping and extending in a same layer as the first and second ground planes up to the second interconnection.

According to another variant, the first and second electronic components are FDSOI transistors of a same NMOS or PMOS type.

According to yet another variant, the first and second transistors are placed in a same row of transistors, the second ground plane being surrounded by semiconductors having the first type of doping in the layer including the first and second ground planes.

According to one variant, the first and second transistors are placed in a same row of transistors, the second ground plane extending on the width of the row.

According to yet another variant, the circuit comprises an electrical junction connecting said first and second interconnections in the semiconducting layer, said first and second interconnections being made in a first well tap having a width of one gate pitch of the first transistor.

According to another variant, the circuit does not comprise the electrical junction connecting said first and second interconnections in the semiconducting layer, said first and second interconnections being prepared in a same well tap having a width of one gate pitch of the first transistor.

According to another variant, the circuit does not have an electrical junction connecting said first and second interconnections in the semiconducting layer, said first and second interconnections being made in a same well tap having a width of two gate pitches of the first transistor.

According to another variant, the circuit further comprises:
- a third FDSOI transistor of a type opposite that of the first transistor formed in and/or on said semiconducting layer;
- a fourth FDSOI transistor of the same type as the third transistor and formed in and/or on said semiconducting layer;
- the bias circuit being configured to generate a second bias voltage;
- third and fourth via-type interconnections to which the bias circuit applies a same bias voltage equal to the second bias voltage;
- at least one second insulation trench separating the third transistor from the third and fourth interconnections in the semiconducting layer;
- a third ground plane having a third type of doping placed beneath the buried insulating layer plumb with the third transistor and extending beneath the first insulation trench, and up to contact with the third interconnection;
- a second well having a fourth type of doping opposite the third type, placed plumb with the third ground plane and extending beneath the first insulation trench and up to contact with the fourth interconnection;
- a fourth ground plane having the fourth type of doping, placed plumb with the buried insulating layer plumb with fourth transistor, the second well extending up to contact with the fourth ground plane.

According to yet another variant, the first and second wells have a same type of doping.

According to yet another variant, said first well is separated from the substrate by a deep well made plumb with the first well.

According to one variant, said substrate has P-type doping.

BRIEF DESCRIPTION OF THE DRAWINGS

Other features and advantages of the invention shall emerge more clearly from the following description, made by way of an indication that is no way exhaustive, and with reference to the appended drawings, of which.

DETAILED DESCRIPTION

Figure 1:
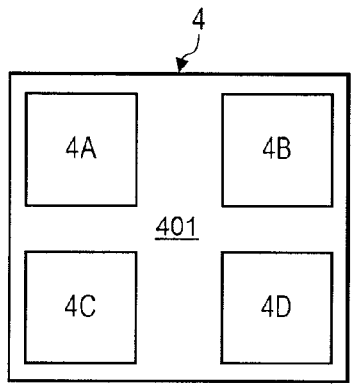
FIG. 1 schematically illustrates a top view in section of an integrated circuit at the level of the wells.

FIG. 1 illustrates an integrated circuit 4 including, on the one hand, two regions 4A and 4B comprising SRAM-type memory cells, and, on the other hand, regions 4C and 4D comprising logic gates. These different regions 4A to 4D are made on a same silicon substrate 401.

Figure 2:
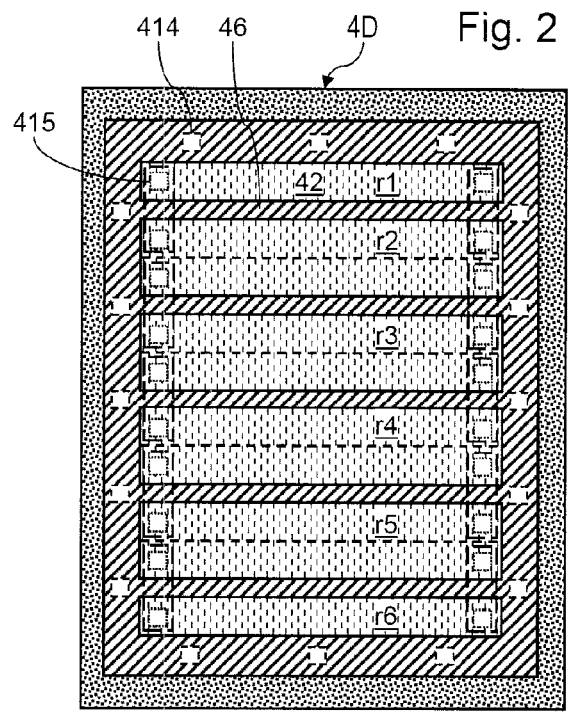
FIG. 2 is a schematic view in section at the level of the wells of a first example of an integration region.

FIG. 2 is a schematic view in section of the region 4D at a well layer. The region 4D comprises especially transistors each comprising a gate stack. These transistors are typically FDSOI-type transistors. The transistors of the region 4D are made in a manner known per se on a buried layer of insulator known as an ultra-fine layer (typically designated by the acronym FDSOI). The buried layer of insulator is made on a ground plane layer. The ground plane layer is made on a well layer. The well layer is made on a deeply-buried N-type well layer (called a "deep n-well"). The deep n-well layer is itself made on the silicon substrate 401, which is typically a P-doped layer.

In the region 4D, we can distinguish a P-doped region 42 forming wells of rows r1 to r6 of transistors. Contacts 414 for biasing the deep n-well can be seen. It is also possible to distinguish contacts 415 for biasing the ground planes of the transistors at the ends of the rows r1 to r6.

A region 46 is seen, forming deep insulation trenches insulating the rows of adjacent transistors up to the well layer. Each row contains transistors of a same type, insulated by insulation trenches. The adjacent rows form an alternation of NMOS and PMOS transistors.

FIGS. 3 to 7 illustrate a possible example of a structure of the region 4D. FIGS. 3 to 7 are different views in section at the level of a group of transistors belonging to an adjacent row and/or comprising ground planes, having opposite type dopings.

The group of transistors illustrated comprises PMOS transistors in a first row and comprises NMOS transistors in a second adjacent row. These sources, drains and gates of the transistors are made in and/or on an active semiconducting layer, the semiconducting layer being made on a buried insulating layer. These transistors are FDSOI-type transistors. The first row and the second row are separated by an insulation trench 46. The first row comprises a transistor p1 and a transistor p2. The transistors p1 and p2 are separated by an insulation trench (not shown) in the thickness of the active semiconducting layer. The second row comprises a transistor n1 and a transistor n2. The transistors n1 and n2 are separated by an insulation trench 49 in the thickness of the active semiconducting layer. The insulation trench 49 also separates the transistor p1 from the interconnection vp1 in the thickness of the active semiconducting layer.

Figure 3:
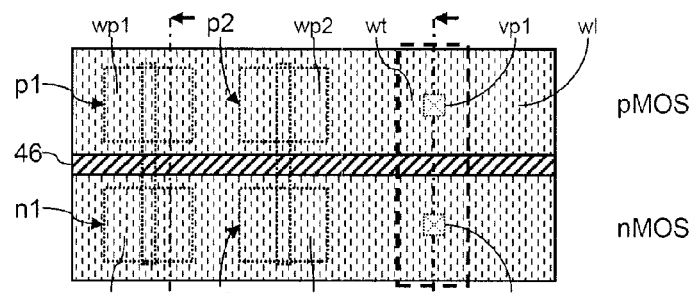
FIGS. 3 and 4 are top views in section of a part of an integration region according to a development that can be envisaged but is not optimal, respectively at the level of the wells and of the ground planes.
Figure 4:
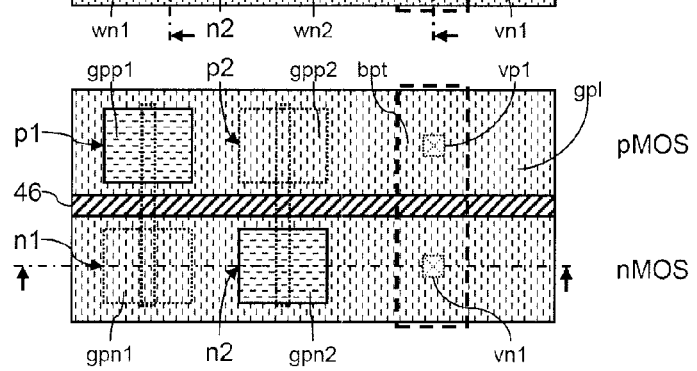
Figure 5:
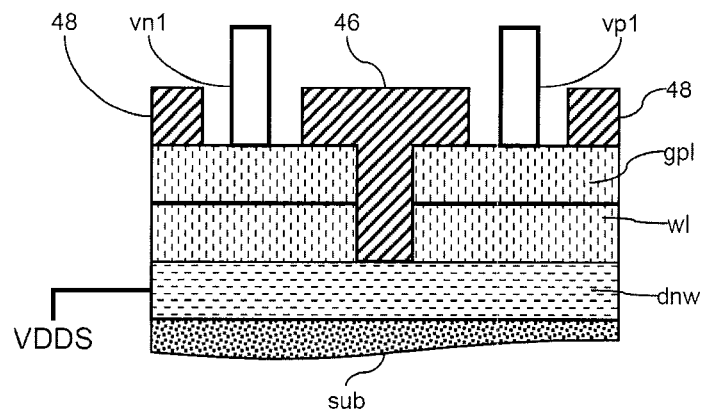
FIG. 5 is a side view in section of the region of FIGS. 3 and 4 at the level of a well tap.
Figure 6:
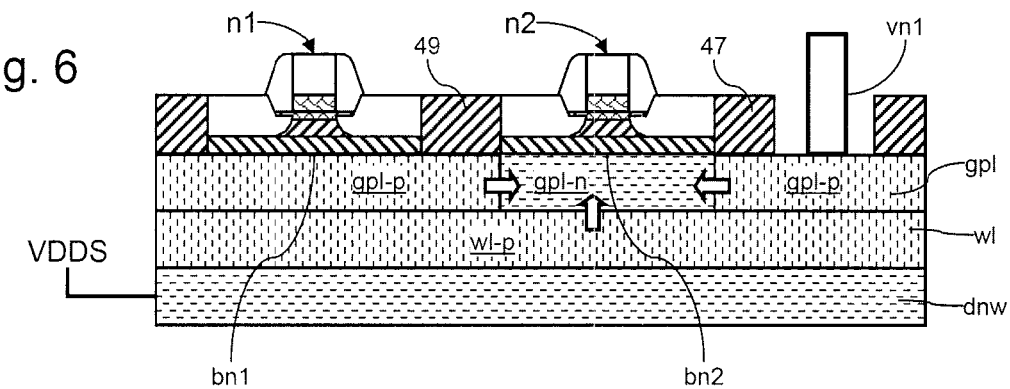
FIG. 6 is a side view in section of the region of FIGS. 3 and 4 at the level of a row of NMOS transistors.
Figure 7:
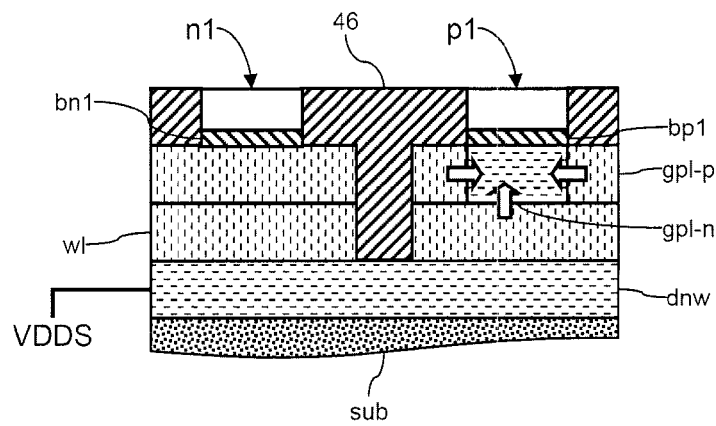
FIG. 7 is a side view in section of the region of FIGS. 3 and 4 at the level of an NMOS transistor and an adjacent PMOS transistor.

FIG. 3 is a top view in section of the region 4D at its well layer w1. FIG. 4 is a top view in section of the region 4D at its ground plane layer gp1. FIG. 5 is a side view in section of the region 4D at the via-type interconnections vp1 and vn1. FIG. 6 is a front view in section of the region 4D at the row of NMOS transistors. FIG. 7 is a side view in section of the region 4D at an active layer of transistors.

For the sake of readability, the interconnections vp1 and vn1 have been shown in projection by means of dots in FIGS. 3 and 4. Similarly, the demarcation of the active layer of the different transistors has been represented in projection in FIGS. 3 and 4.

Via-type interconnections vn1 and vp1 are made through the active semiconducting layer. The interconnection vp1 is designed to bias the ground planes of the PMOS transistors. The interconnection vn1 is designed to bias the ground planes of the NMOS transistors.

A via-type interconnection generally designates a conductive junction made in a hole passing through different silicon layers. Such interconnections are thus usually integrated in order to make an interlayer interconnection inside the integrated circuit.

The well layer w1 has two semiconducting regions separated by the insulation trench 46. The two semiconducting regions have a P-type doping. The well parts wp1, wp2, wn1 and wn2, arranged respectively plumb with the transistors p1, p2, n1 and n2, thus have a same P-type doping. The well part wt is laid out so as to be plumb with a well tap including the interconnections vp1 and vn1.

The ground plane layer gp1 has two semiconducting regions separated by the insulation trench 46. The two semiconducting regions have a P-type doping on the totality of their surface except for the ground plane regions gpp1 and gpn2 arranged respectively so as to be plumb with the transistors p1 and n2. The ground plane regions gpp1 and gpn2 thus have an N-type doping. The ground plane regions gpp2 and gpn1 thus have a P-type doping. The ground plane region bpt is placed plumb with the well tap including the interconnections vp1 and vn1.

The interconnection vn1 extends in depth up to contact with the ground plane layer gp1, on a P-doped region gp1-$p$. The interconnection vp1 extends in depth up to contact with the ground plane layer gp1, on a P-doped region gp1-$p$. A bias circuit not shown applies bias voltages to the interconnections vp1 and vn1.

The well layer w1 is separated from the substrate sub by means of a deep n-well, dnw, in order to enable the application of a different bias to the ground planes and to the substrate sub. In the example, the substrate sub is biased at a voltage Vdds. The insulation trench 46 extends in depth up to the deep n-well dnw in order to provide insulation between the rows of transistors. Insulation rows 48 demarcate the row of PMOS transistors with respect to an adjacent row of PMOS transistors, and the row of NMOS transistors with respect to an adjacent row of NMOS transistors. The insulation trenches 48 provide insulation between these adjacent rows in the thickness of the semiconducting active layer.

The biasing of the ground plane gpp1 is achieved by the interconnection vp1 by means of the ground plane region gp1-$p$ and by means of the well layer w1, forming a P-doped semiconducting path. The biasing of the ground plane gpp2 is achieved by the interconnection vp1 by means of the ground plane region gp1-p forming a P-doped semiconducting path. The biasing of the ground plane gpn1 is achieved by the interconnection vn1 by means of the ground plane region gp1-p and by means of the well layer w1 forming a P-doped semiconducting path. The biasing of the ground plane gpp2 is achieved by the interconnection vn1 by means of the ground plane region gp1-p forming a semiconducting P-doped path.

Such a structure however has the drawback of requiring considerable biasing time (possibly up to several seconds) of the N-doped ground planes. Indeed, the biasing of the N-doped ground planes relies here on the generation/recombination of the carriers at their interface with the surrounding P-doped ground plane layer and at their interface with the P-doped well layer as illustrated in FIGS. 6 and 7.

FIGS. 8 to 13 illustrate a first variant of a structure of the region 4D according to the invention, aimed at optimizing its operation. FIGS. 8 to 13 are different views in section at the level of a group of transistors belonging to adjacent rows and/or comprising ground planes, the dopings of which are of opposite types.

The group of transistors illustrated comprises PMOS transistors in a first row and comprises NMOS transistors in a second adjacent row. Well taps are arranged at regular intervals in the rows. The sources, drains and gates of the transistors are made in and/or on an active semiconducting layer, the semiconducting layer being made on a buried insulating layer. The insulating layer can advantageously be of a thickness known as an ultra-fine thickness typically ranging from 10 to 50 nm. These transistors are FDSOI type transistors. The active silicon layer of an NMOS transistor comprises an N-doped source, a channel and an N-doped drain. The active silicon layer of a PMOS transistor comprises a P-doped source, a channel and a P-doped drain. The channel is lined with a gate oxide layer. The gate oxide is surmounted by a gate stack comprising a metal layer and a polysilicon layer. The stack is demarcated laterally by spacers.

The first row and the second row are separated by an insulation trench 46. The first row comprises a transistor p1 and a transistor p2. The transistors p1 and p2 are separated by an insulation trench (not shown) in the thickness of the active semiconducting layer. The second row comprises a transistor n1 and a transistor n2. The transistors n1 and n2 are separated by an insulation trench 49 in the thickness of the active semiconducting layer.

Figure 8:
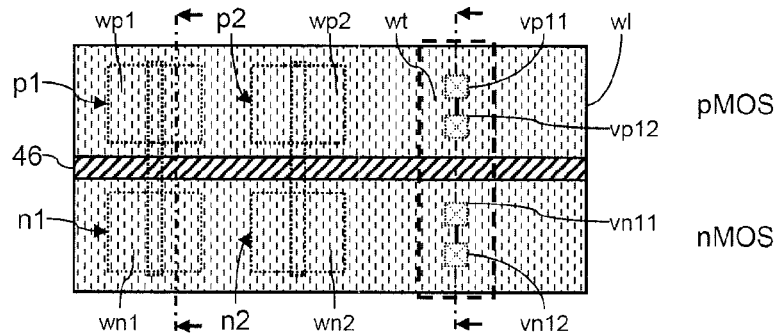
FIGS. 8 and 9 are top views in section of a part of an integration region according to one variant of the invention, at the level respectively of the wells and the ground planes.
Figure 9:
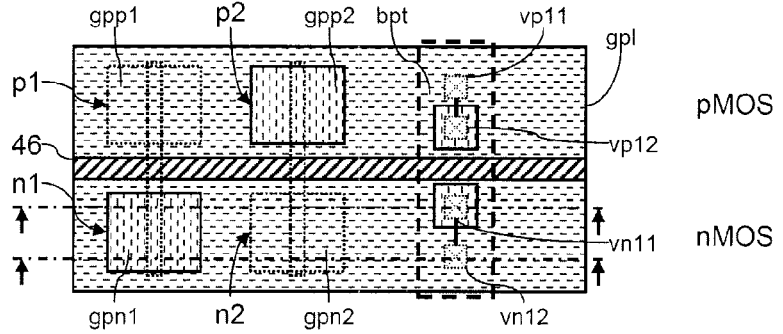
Figure 10:
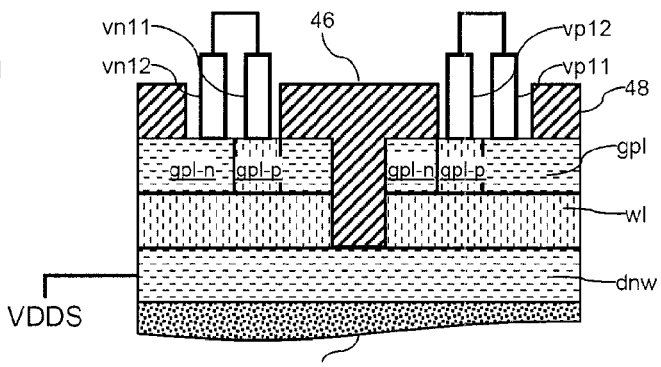
FIG. 10 is a side view in section of the region of FIGS. 8 and 9 at the level of a well tap.
Figure 11:
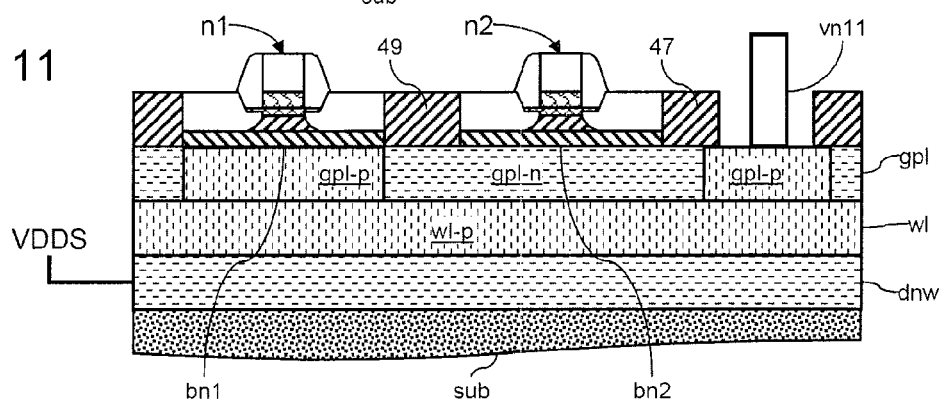
FIG. 11 is a front view in section of the region of FIGS. 8 and 9 at the level of a row of NMOS transistors.
Figure 12:
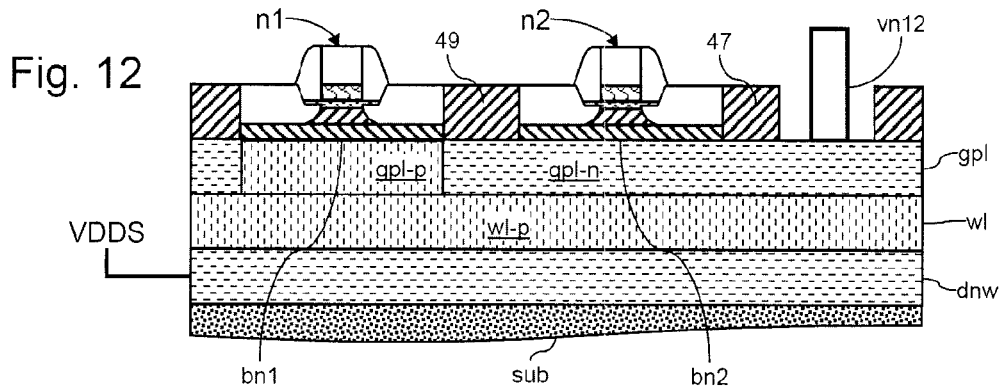
FIG. 12 is another front view in section of the region of FIGS. 8 and 9 at the level of a row of NMOS transistors.
Figure 13:
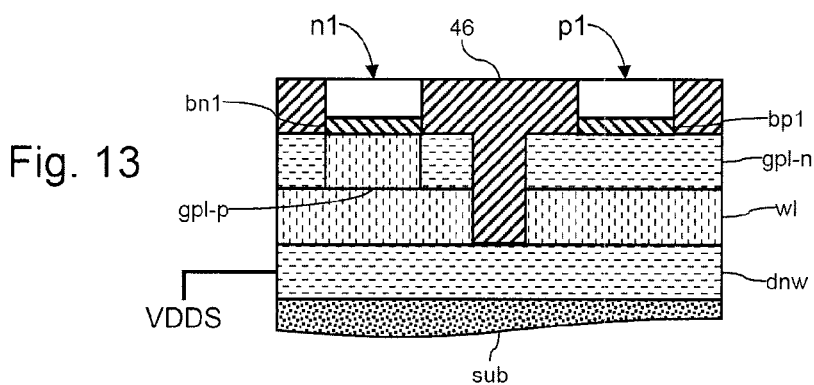
FIG. 13 is a side view in section of the region of FIGS. 8 and 9 at the level of an NMOS transistor and an adjacent PMOS transistor.

FIG. 8 is a top view in section of the region 4D at the level of its well layer w1. FIG. 9 is a top view in section of the region 4D at the level of its ground plane layer gp1. FIG. 10 is a side view in section of the region 4D at the level of via-type interconnections vp11, vp12, vn11 and vn12. FIG. 11 is a front view in section of the region 4D at the level of the row of NMOS transistors and the interconnection vn11. FIG. 12 is a front view in section of the region 4D at the level of the row of NMOS transistors and the interconnection vn12. FIG. 13 is a side view in section of the region 4D at the level of an active layer of transistors.

For the sake of readability, the interconnections vp11, vp12, vn11 and vn12 have been shown in projection by means of dots in FIGS. 8 and 9. Similarly, the demarcation of the active layer of the different transistors has been represented in projection in FIGS. 8 and 9.

The via-type interconnections vp11, vp12, vn11 and vn12 are made through the active semiconducting active layer and the buried insulating layers bn1 and bn2. The interconnections vp11 and vp12 are designed to bias the ground planes of the PMOS transistors. The interconnections vn11 and vn12 are for biasing the ground planes of the NMOS transistors.

The well layer w1 has two semiconducting regions separated by the insulation trench 46. The two semiconducting regions comprise a P-type doping. The well regions wp1, wp2, wn1 and wn2, respectively plumb with the transistors p1, p2, n1 and n2 thus comprise a same P-type doping. The well region wt is plumb with a well tap including the interconnections vp11, vp12, vn11 and vn12.

The ground plane layer gp1 has two semiconducting regions separated by the insulation trench 46. The two semiconducting regions comprise an N-type doping on their entire surface, except for the ground plane regions gpp2 and gpn1 plumb with the transistors p2 and n1. The ground plane regions gpp2 and gpn1 thus have a P-type doping and form islet-like features in an N-doped ground plane region gp1-n. The ground plane regions gpp1 and gpn2 thus have N-type doping. The ground plane region vpt is plumb with the well tap including the interconnections vp11, vp12, vn11 and vn12.

The ground planes improves the electrostatic control of the transistors in limiting the penetration of the electrical fields generated by the drain and the source beneath the channel. The reduction of the lateral electrostatic coupling reduces the short-channel effect and limits the depletion effect through DIBL (drain-induced barrier lowering).

The interconnections vp12 and vn11 extend in depth up to contact with the ground plane layer gp1 on a P-doped region gp1-p. A bias circuit (not shown) applies bias voltages to the interconnections vp11, vp12, vn11 and vn12. A same bias voltage is applied to the interconnections vp11 and vp12. A same bias voltage is applied to the interconnections vn11 and vn12. The bias voltage of the interconnection vp11 could be distinct from the bias voltage of the interconnection vn11.

The well layer w1 is separated from the substrate sub by a means of a deep n-well dnw in order to enable the application of a different bias to the ground planes and to the substrate sub without any risk of creating a parasitic conductive p-n junction. In the example, the deep n-well dnw is biased at a voltage Vdds. The insulation trench 46 extends in depth up to the deep n-well dnw. The insulating layer 46 and the deep n-well dnw provide insulation between the rows of NMOS and PMOS transistors. Insulating rows 48 demarcate the row of PMOS transistors relatively to an adjacent row of PMOS transistors, and the row of NMOS transistors relatively to an adjacent row of NMOS transistors. The insulation trenches 48 provide for insulation between these adjacent rows in the thickness of the active semiconducting layer.

The biasing of the ground plane gpp1 is done by the interconnection vp11 by means of the ground plane region gp1-n forming an N-doped semiconductor path. The biasing of the ground plane gpp2 is done by the interconnection vp12 by means of the ground plane region gp1-p and the well layer w1 forming a P-doped semiconducting path. The biasing of the ground plane gpn1 is done by the interconnection vn11 by means of the ground plane region gp1-p and by means of the well layer w1 forming a P-doped semiconducting path. The biasing of the ground plane gpp2 is done by the interconnection vn12 by means of the ground plane region gp1-n forming an N-doped semiconducting path.

Thus, each ground plane of the transistors can be forward biased by a semiconducting path having a same type of doping even when these transistors are separated from the interconnections by insulation trenches present in the active semiconducting layer. This can be done even for rows comprising transistors, the ground planes of which are oppositely doped. Such a result is furthermore obtained by means of a simple structure, with a well layer having a same type of doping for the rows of NMOS transistors and the rows of PMOS transistors.

FIGS. 14 to 19 illustrate different variants of standard cells for the well taps intended for designing the topology of the integrated circuit 4 as defined in the example of FIGS. 8 and 9.

Figure 14:
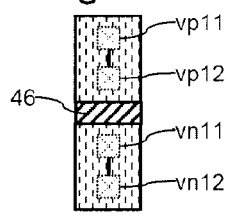
FIGS. 14 to 16 represent different variants of well taps in section at the level of the well.
Figure 17:
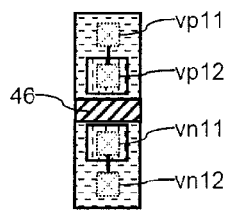
FIGS. 17 to 19 represent different variants of well taps in section at the level of the ground plane.

FIGS. 14 and 17 illustrate a first variant of design of a well tap. FIG. 14 corresponds to the section of this well tap at the level of the well layer. FIG. 17 corresponds to the section of this well tap at the level of the ground plane layer. In this example, the interconnections vp11, vp12 or vn11, vn12 use a common active layer on a gate pitch width (illustrated by the line connecting the interconnections represented in projection). This variant corresponds to the example implemented in FIGS. 8 to 13.

Figure 15:
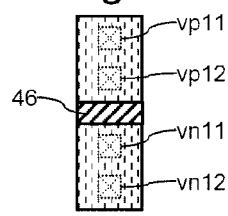
Figure 18:
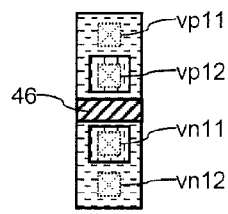

FIGS. 15 and 18 illustrate a second variant of design of a well tap. FIG. 15 corresponds to the section of this well tap at the well layer. FIG. 18 corresponds to the section of this well tap at the ground plane layer. In this example, the interconnections vp11, vp12 or vn11, vn12 use a distinct active layer or region on a gate pitch width.

Figure 16:
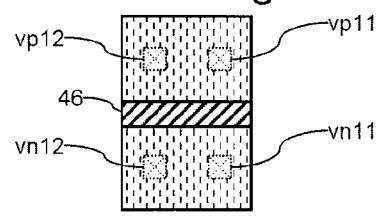
Figure 19:
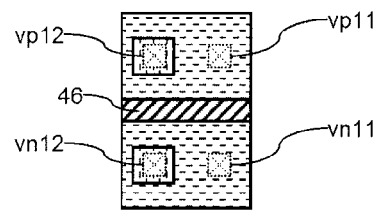

FIGS. 16 and 19 illustrate a third variant of design of a well tap. FIG. 16 corresponds to the section of this well tap at the well layer. FIG. 18 corresponds to the section of this well tap at the ground plane layer. In this example, the interconnections vp11, vp12 or vn11, vn12 use a distinct active layer on twice the gate pitch width.

These different variants make it possible to envisage different designs of the well taps as a function of the constraints of spacing between the adjacent interconnections in a same row of transistors.

FIGS. 20 to 25 illustrate a second variant of a structure of the region 4D according to the invention, aimed at optimizing its operation. FIGS. 20 to 25 are different views in section at the level of a group of transistors belonging to adjacent rows and/or comprising oppositely doped ground planes. This second variant calls for lesser precision in the manufacturing method to obtain the doping of the different regions of the ground plane layer.

As in the variant of FIGS. 8 to 13, the group of transistors illustrated comprises PMOS transistors p1 and p2 separated by an insulation trench 49 in a first row and comprises NMOS transistors n1 and n2 separated by an insulation trench 47 in a second adjacent row, the rows being separated by the insulation trench 46. The sources, drains and gates of the transistors are made in and/or on an active semiconducting layer, the semiconducting layer being made on a buried insulating layer. These transistors are FDSOI-type transistors.

Figure 20:
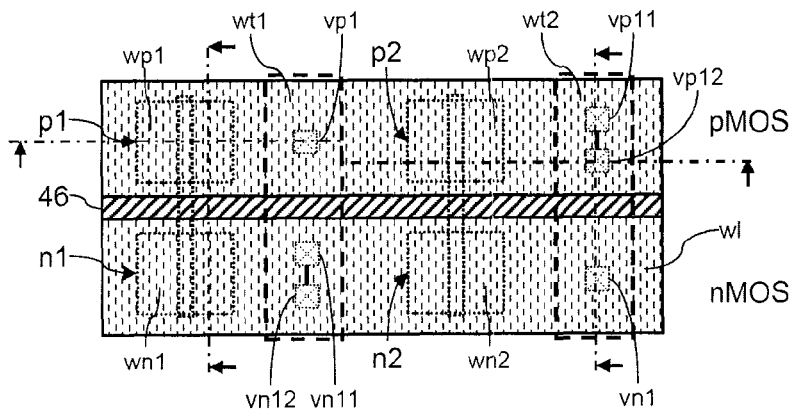
FIGS. 20 and 21 are top views in section of a part of another variant of the integration region, at the level respectively of the wells and of the ground planes.
Figure 21:
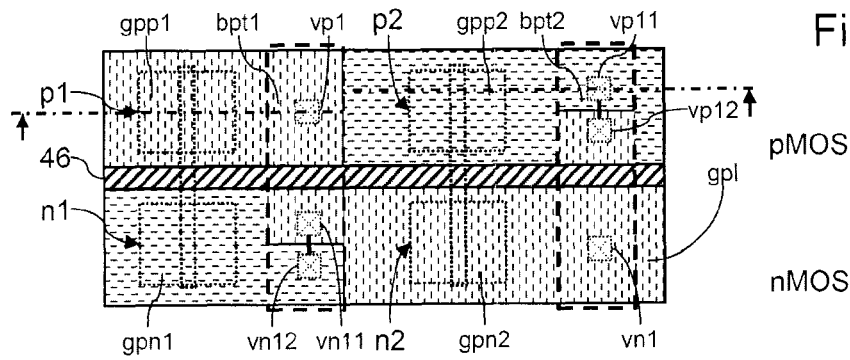
Figure 22:
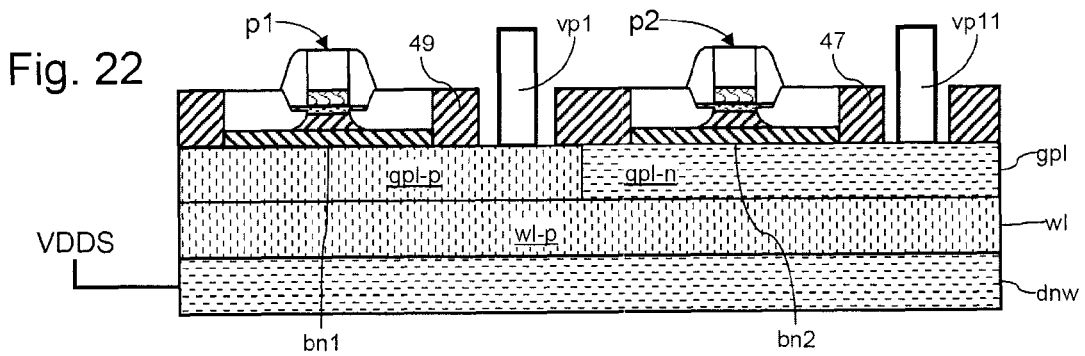
FIG. 22 is a front view in section of the region of FIGS. 20 and 21 at the level of a row of PMOS transistors.
Figure 23:
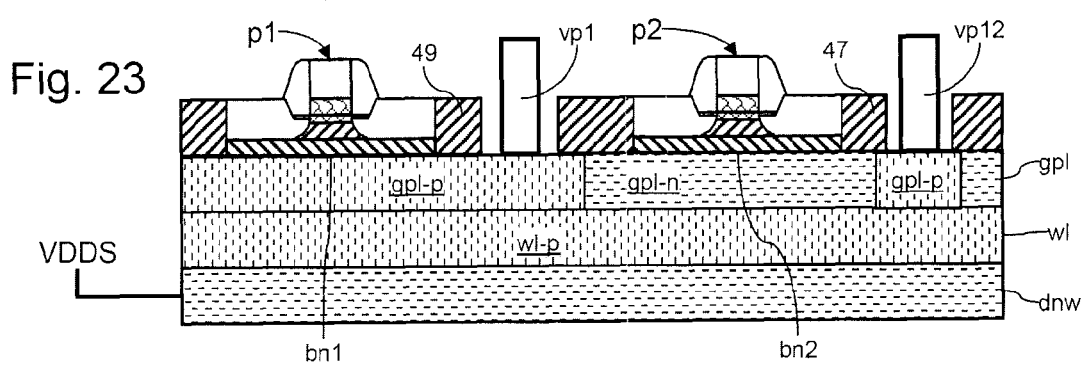
FIG. 23 is another front view in section of the region of FIGS. 20 and 21 at the level of a row of PMOS transistors.
Figure 24:
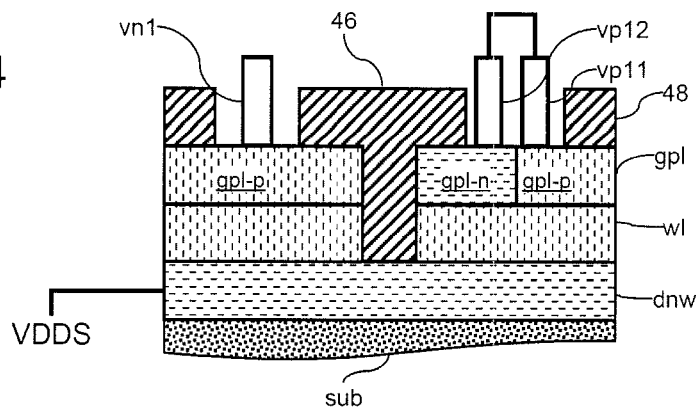
FIG. 24 is a side view in section of the region of FIGS. 20 and 21 at the level of a well tap.
Figure 25:
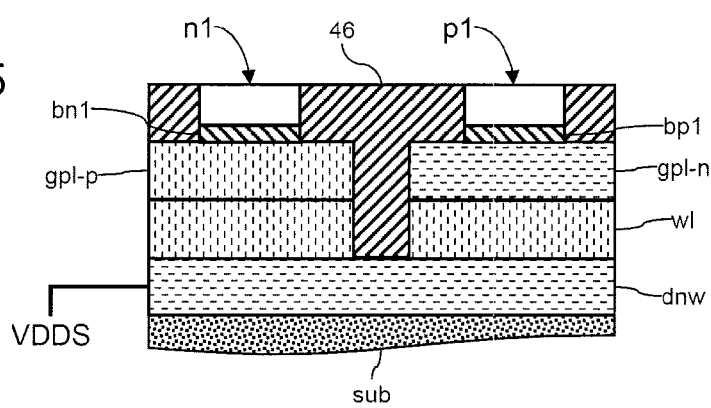
FIG. 25 is a side view in section of the region of FIGS. 20 and 21 at the level of an NMOS transistor and an adjacent PMOS transistor.

FIG. 20 is a top view in section of the region 4D at the level of its well layer w1. FIG. 21 is a top view in section of the region 4D at the level of the ground plane layer gp1. FIG. 22 is a front view in section of the region 4D at a row of PMOS transistors, seen at the level of the interconnection vp11. FIG. 23 is a front view in section of the region 4D at a row of PMOS transistors, seen at the level of the interconnection vp12. FIG. 24 is a side view in section of the region 4D at the level of the via-type interconnections vp11, vp12 and vn1. FIG. 25 is a side view in section of the region 4D at the level of an active layer of transistors. The via-type interconnections vp11, vp12, vp1, vn1, vn11 and vn12 are made through the active semiconducting layer and the buried insulating layer.

The well layer w1 has two semiconducting regions separated by the insulating layer 46. The two semiconducting regions have a P-type doping. The well regions wp1, wp2, wn1 and wn2, respectively plumb with the transistors p1, p2, n1 and n2, thus have a same P-type doping. The well region wt1 is plumb with a well tap including the interconnections vp1, vn11 and vn12. The well region wt1 is positioned between the well regions wp1 and wp2. The well region wt2 is plumb with a well tap including the interconnections vn1, vp11 and vp12.

The ground plane layer gp1 has two semiconducting regions separated by the insulation trench 46. The ground plane region bpt1 is plumb with the well tap including the interconnections vp1, vn11 and vn12. The ground plane region bpt2 is plumb with the well tap including the interconnections vn1, vp11 and vp12. Plumb with the transistors p1 and n2, throughout the width of their standard cell, the ground plane layer gp1 comprises a P-type doping. Plumb with the transistors p2 and n1, throughout the width of their standard cell, the ground plane layer gp1 comprises an N-type doping. Plumb with the interconnections vp1 (positioned between the transistors p1 and p2) and vn2, throughout the width of their standard cell, the ground plane layer gp1 comprises a P-type doping. Plumb with the interconnections vn12 (positioned between the transistors n1 and n2) and vp11, throughout the width of their standard cell, the ground plane layer gp1 comprises an N-type doping. Plumb with the interconnections vn11 (positioned between the transistors n1 and n2) and vp12, throughout the width of their standard cell, the ground plane layer gp1 comprises a P-type doping.

The interconnections vp1, vn11 and vp12 extend in depth up to contact with the ground plane layer gp1 on a P-doped region gp1-$p$. The interconnections vn1, vn12 and vp11 extend in depth up to contact with the ground plane layer gp1 on an N-doped region gp1-$n$. A bias circuit not shown applies bias voltages on the interconnections vp1, vp11, vp12, vn1, vn11 and vn12. A same bias voltage is applied to the interconnections vp1, vp11 and vp12. A same bias voltage is applied to the interconnections vn1, vn11 and vn12. The bias voltage of the interconnection vp1 could be distinct from the bias voltage of the interconnection vn1.

The well layer w1 is separated from the substrate sub by means of a deep n-well dnw. In the example, the deep n-well is biased at a voltage Vdds. The insulation trench 46 extends in depth up to the deep n-well dnw.

The biasing of the ground plane gpp1 is obtained by the interconnection vp12 by means of the ground plane region gp1-$p$ and the ground plane layer w1 forming a P-doped semiconducting path (and redundantly by the interconnection vp1 by means of the ground plane region gp1-$p$ forming a P-doped semiconducting path). The biasing of the ground plane gpp2 is made by the interconnection vp11 by means of the ground plane region gp1-$n$ forming an N-doped semiconducting path. The biasing of the ground plane gpn1 is obtained by the interconnection vn12 by means of the ground plane region gp1-$n$. The biasing of the ground plane gpp2 is obtained by the interconnection vn11 and the interconnection vn1 by means of the ground plane region gp1-$p$.

Thus, each ground plane of the transistors can be forward biased by a semiconducting path having a same type of doping, even when these transistors are separated from the interconnections by insulation trenches present in the active layer of semiconducting.

In this structure, the interconnections vp1, vp12 and vn1, vn11 provide for a redundancy of biasing of their respective wells. A lesser homogeneity of biasing would also be obtained by eliminating the interconnections vp12 and vn11. At the same time, this would enable satisfactory operation of the integrated circuit. Such an elimination would facilitate especially the method for manufacturing the integrated circuit.

FIGS. 26 to 37 illustrate different variants of standard cells for the well taps for designing the topology of the integrated circuit 4 as defined in the example of FIGS. 20 and 21.

Figure 26:
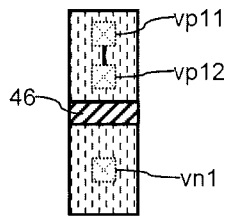
FIGS. 26 to 29 represent different variants of well taps in section at the level of the well.
Figure 30:
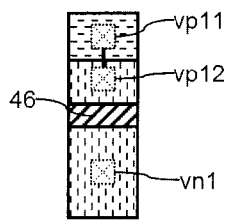
FIGS. 30 to 33 represent different variants of well taps in section at the level of the ground plane.

FIGS. 26 and 30 illustrate a first variant of a design of a well tap. FIG. 26 corresponds to the section of this well tap at the well layer. FIG. 30 corresponds to the section of this well tap at the ground plane layer. In this example, the interconnections vp11 and vp12 use a common active layer on a gate pitch width (illustrated by the line connecting the interconnections shown in projection). This variant corresponds to the example implemented in FIGS. 20 to 25.

Figure 27:
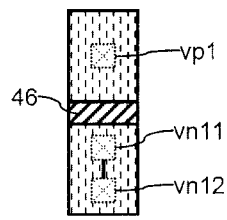
Figure 31:
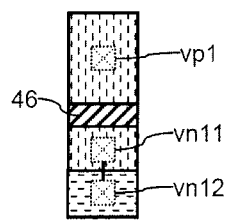

The FIGS. 27 and 31 illustrate a complement to the first variant of design of a well tap. FIG. 27 corresponds to the section of this well tap at the well layer. FIG. 31 corresponds to the section of this well tap at the ground plane layer. In this example, the interconnections vn11 and vn12 use a common active layer on a gate pitch width. This variant corresponds to the example implemented in FIGS. 20 to 25.

Figure 28:
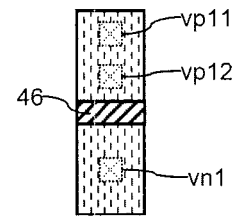
Figure 32:
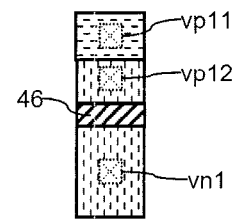

FIGS. 28 and 32 illustrate a second variant of design of a well tap. The FIG. 28 corresponds to the section of this well tap at the level of the well layer. FIG. 32 corresponds to the section of this well tap at the level of the ground plane layer. In this example, the interconnections vp11 and vp12 use a distinct active layer on a gate pitch width. The dopings of the ground plane layers and of the well are identical to those of the variant described with reference to FIGS. 26 and 30.

Figure 29:
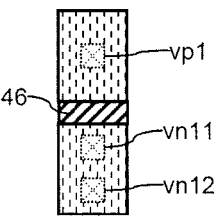
Figure 33:
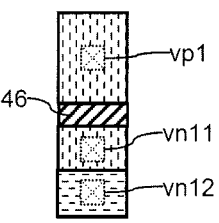

FIGS. 29 and 33 illustrate a complement to the second variant of design of a well tap. FIG. 29 corresponds to the section of this well tap at the well layer. FIG. 33 corresponds to the section of this well tap at the ground plane layer. In this example, the interconnections vn11 and vn12 use a distinct active layer on a gate pitch width. The doping of the ground plane layers and of the well are identical to those of the variant of FIGS. 27 and 31.

Figure 34:
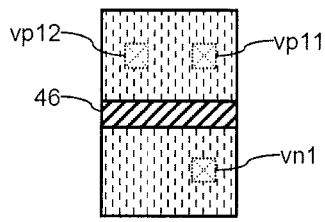
FIGS. 34 and 35 represent different variants of well taps in section at the level of the well.
Figure 36:
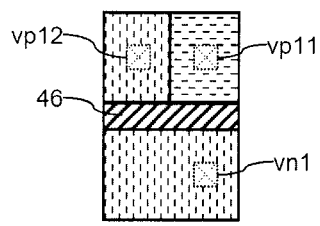
FIGS. 36 and 37 represent different variants of well taps in section at the level of the ground plane.

FIGS. 34 and 36 illustrate a third variant of design of a well tap. FIG. 34 corresponds to the section of this well tap at the level of the well layer. FIG. 36 corresponds to the section of this well tap at the level of the ground plane layer. In this example, the interconnections vn1, vp11 and vp12 use a distinct active layer on twice the gate pitch length.

Figure 35:
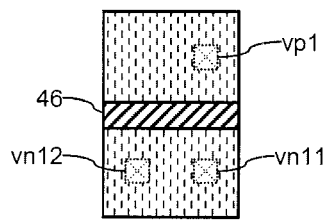
Figure 37:
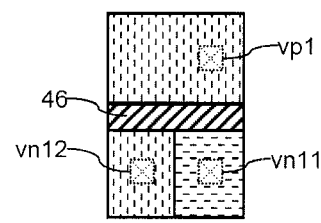

FIGS. 35 and 37 illustrate a complement of the third variant of design of a well tap. FIG. 35 corresponds to a section of this well tap at the well layer. FIG. 37 corresponds to the section of this well tap at the ground plane layer. In this example, the interconnections vp1, vp11 and vn12 use a distinct active layer on a gate pitch width.

Figure 38:
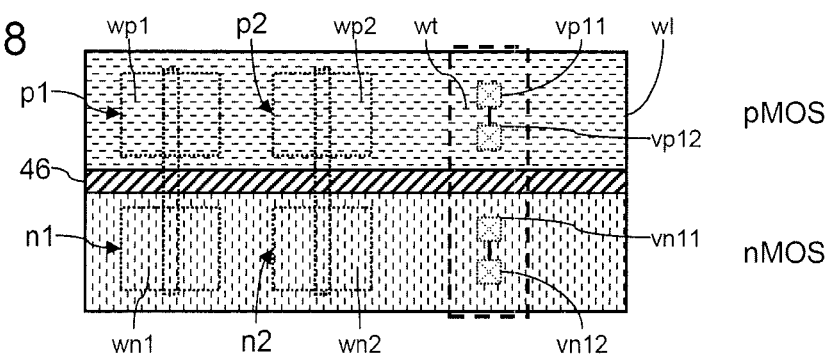
FIGS. 38 and 39 are top views in section of a part of another variant of an integration region respectively at the level of the wells and the ground planes.
Figure 39:
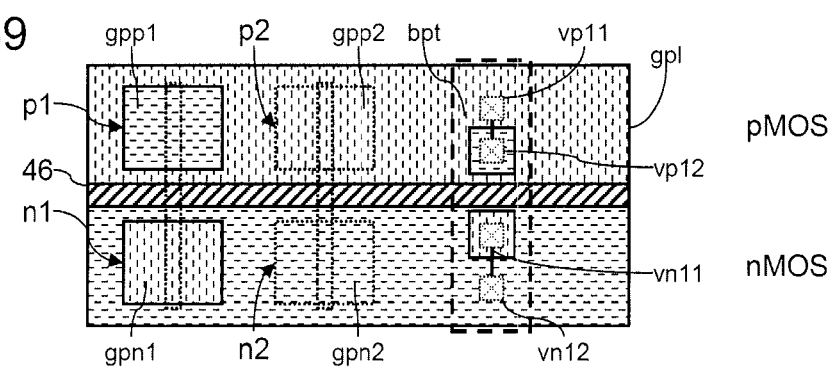

FIGS. 38 and 39 illustrate a third variant of an integrated structure according to the invention, aimed at optimizing its operation. FIGS. 38 and 39 are top views in section at the level of a group of transistors belonging to adjacent rows and/or comprising oppositely doped ground planes. FIG. 38 is a view in section of the structure at the level of its well layer w1. FIG. 39 is a top-section view of the structure at the level of its ground plane layer gp1.

As in the variant of FIGS. 8 to 13, the group of transistors illustrated comprises PMOS transistors p1 and p2 separated by an insulation trench in a first row and comprises NMOS transistors n1 and n2 separated by an insulation trench 49 in a second adjacent row, the rows being separated by the insulation trench 46. The sources, drains and gates of the transistors are made in and/or on an active semiconducting layer, the semiconducting layer being made on a buried insulating layer. These transistors are of the FDSOI type.

The structure comprises via-type interconnections vp11, vp12, vn11 and vn12. The via-type interconnections vp11, vp12, vn11 and vn12 are made through the semiconducting active layer and the buried insulating layer.

The well layer w1 has two semiconducting regions separated by the insulation trench 46. The semiconducting region plumb with the NMOS transistors comprises a P-type doping. The semiconducting region plumb with the PMOS transistors comprises an N-type doping. The well regions wp1 and wp2 plumb with the transistors p1 and p2 thus respectively comprise a same N-type doping. The well regions wn1 and wn2 plumb with the transistors n1 and n2 respectively thus comprise a same P-type doping. The well region wt is thus plumb with a well tap including the connections vp11, vp12, vn11 and vn12.

The ground plane layer gp1 presents two semiconducting regions separated by the insulation trench 46. The ground plane region bpt is plumb with the well tap including the interconnections vp11, vp12, vn11 and vn12. The semiconducting region corresponding to the NMOS transistors comprises a P-type doping throughout its surface except for the ground plane region gpp1 plumb with the transistor p1 (which forms an islet-like feature in a P-doped ground plane region gp1-p). The ground plane region gpp2 thus has a P-type doping. The semiconducting region corresponding to the PMOS transistors comprises N-type doping on its entire surface except for the ground plane region gpn1 positioned so as to be plumb with the transistor n1 (which forms an islet-like feature in an N-doped ground plane region gp1-n). The ground plane region gpn2 thus has N-type doping.

The interconnections vp11 and vn12 extend in depth up to contact with the ground plane layer gp1 on a P-doped region gp1-p. The interconnections vn12 and vp11 extend in depth up to contact with the ground plane layer gp1 on an N-doped region gp1-n. A bias circuit not shown applies bias voltages to the interconnections vp11, vp12, vn11 and vn12. A same bias voltage is applied to the interconnections vp11 and vp12. A same bias voltage is applied to the interconnections vn11 and vn12. The bias voltage of the interconnection vp11 could be distinct from the bias voltage of the interconnection vn11.

The well layer w1 is separated from the substrate sub by means of a deep n-well dnw. In the example, the deep n-well is biased at a voltage Vdds. The insulation trench 46 extends in depth up to the deep n-well dnw.

The biasing of the ground plane gpp2 is done by the interconnection vp11 by means of the P-doped ground plane region gp1-p. The biasing of the ground plane gpp1 is obtained by the interconnection vp12 by means of the region gp1-n of the ground plane layer and by means of the N-doped well thus forming an N-doped semiconducting path.

The biasing of the ground plane gpn2 is done by the interconnection vn12 by means of the N-doped ground plane region gp1-n. The biasing of the ground plane gpn1 is done by the interconnection vn11 by means of the region gp1-p of the ground plane layer and by means of the P-doped well thus forming a P-doped semiconducting path.

Thus, each ground plane of the transistors can be forward biased by a semiconducting path having a same type of doping even when the transistors are separated from the interconnections by insulation trenches present in the active semiconducting layer.

FIGS. 40 to 45 illustrate different variants of standard cells for the well taps, intended for the designing of the topology of the integrated circuit 4 as defined in the examples of FIGS. 38 and 39.

Figure 40:
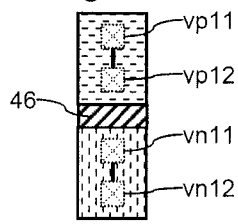
FIGS. 40 to 42 represent different variants of well taps in section at the level of the well.
Figure 43:
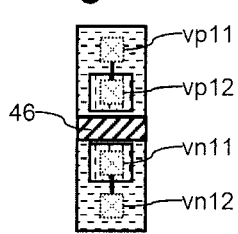
FIGS. 43 to 45 represent different variants of well taps in section at the level of the ground plane.

FIGS. 40 and 43 illustrate a first variant of design of a well tap. FIG. 40 corresponds to the section of this well tap at the level of the well layer. FIG. 43 corresponds to the section of this well tap at the level of the ground plane layer. In this example, the interconnections vp11, vp12 or vn11, vn12 use a common active layer on a gate pitch width (illustrated by the line connecting the interconnections represented in projection). This variant corresponds to the example implemented in FIGS. 38 and 39.

Figure 41:
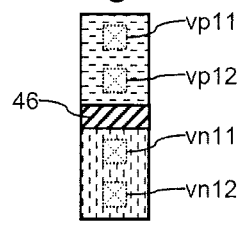
Figure 44:
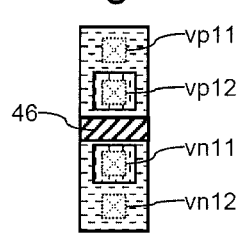

FIGS. 41 and 44 illustrate a second variant of design of a well tap. FIG. 41 corresponds to the section of this well tap at the well layer. FIG. 44 corresponds to the section of this well tap at the ground plane layer. In this example, the interconnections vp11, vp12 or vn11, vn12 use an active semiconducting distinct layer or region on a gate pitch width.

Figure 42:
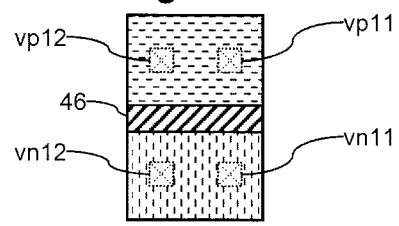
Figure 45:
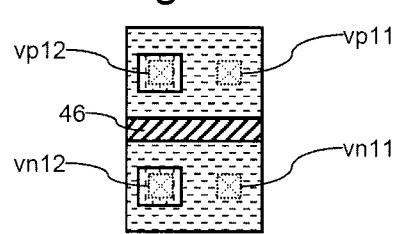

FIGS. 42 and 45 illustrate a third variant of design of a well tap. FIG. 42 corresponds to the section of this well tap at the well layer. FIG. 45 corresponds to the section of this well tap at the ground plane layer. In this example, the interconnections vp11, vp12 or vn11, vn12 use a distinct active semiconducting layer on twice the gate pitch width.

Figure 46:
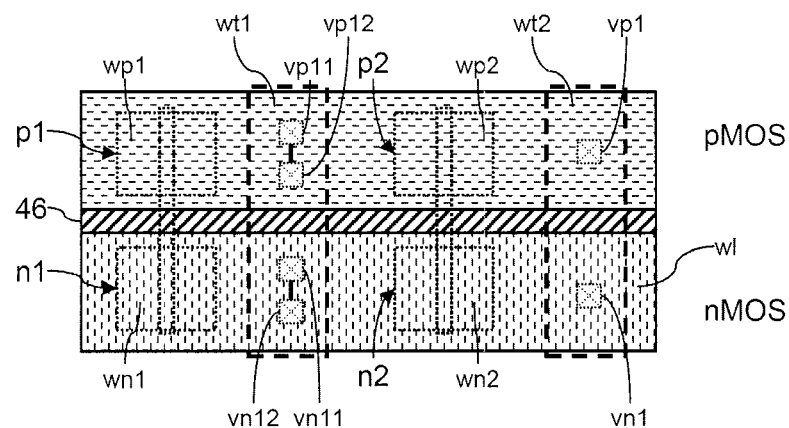
FIGS. 46 and 47 are top views in section of a part of another variant of an integration region respectively at the level of the wells and the ground planes.
Figure 47:
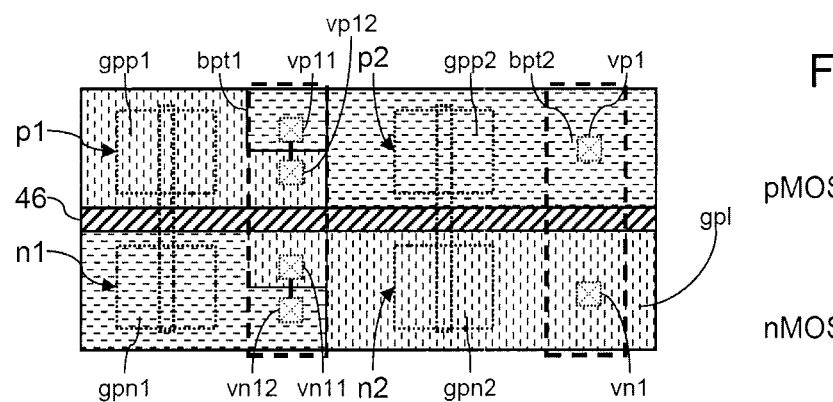

FIGS. 46 and 47 illustrate a fourth variant of an integrated structure according to the invention, aimed at optimizing its operation. FIGS. 46 and 47 are top views in section at the level of a group of transistors belonging to adjacent rows and/or comprising oppositely doped ground planes. FIG. 46 is a view in section of the structure at the level of its well layer w1. FIG. 47 is a top view in section of the structure at the level of its ground plane layer gp1.

As in the variant of FIGS. 20 and 21, the group of transistors illustrated comprises PMOS transistors p1 and p2 separated by an insulation trench in a first row and comprises NMOS transistors n1 and n2 separated by an insulation trench 49 in a second adjacent row, the rows being separated by the insulation trench 46. The sources, drains and gates of the transistors are made in and/or on an active semiconducting layer, the semiconducting layer being made on a buried insulating layer. These transistors are of the FDSOI type.

The structure comprises via-type interconnections vp1, vp11, vp12, vn1, vn11 and vn12. The via-type interconnections vp1, vp11, vp12, vn1, vn11 and vn12 are made through the semiconducting active layer and the buried insulating layer.

The semiconducting region plumb with the NMOS transistors comprises a P-type doping. The semiconducting region plumb with the PMOS transistors comprises an N-type doping. The well regions wp1 and wp2 plumb with the transistors p1 and p2 respectively thus comprise a same N-type doping. The well regions wn1 and wn2 plumb with the transistors n1 and n2 respectively thus comprise a same P-type doping. The well region wt1 is plumb with a well tap including the connections vp11, vp12, vn11 and vn12. The well region wt1 is positioned between well regions wp1 and wp2. The well region wt2 is plumb with a well tap including the interconnections vp1 and vn1.

The ground plane layer gp1 has two semiconducting regions separated by the insulation trench 46. The ground plane region bpt1 is plumb with the well tap including the interconnections vp11, vp12, vn11 and vn12. The ground plane region bpt2 is plumb with the well tap including the interconnections vn1 and vp1. Plumb with the transistors p1 and n2, throughout the length of their standard cell, the ground plane layer gp1 comprises a P-type doping. Plumb with the transistors p2 and n1, throughout the width of their standard cell, the ground plane layer gp1 comprises an N-type doping. Plumb with the interconnections vp11 (positioned between the transistors p1 and p2) and vn12 (positioned between the transistors n1 and n2), throughout the width of their standard cell, the ground plane layer gp1 comprises an N-type doping. Plumb with the interconnections vp12 (positioned between the transistors p1 and p2) and vn11 (positioned between the transistors n1 and n2), throughout the width of their standard cell, the ground plane layer gp1 comprises a P-type doping.

The interconnections vn1, vn11 and vp12 extend in depth up to contact with the ground plane layer gp1 on a P-doped region gp1-$p$. The interconnections vp1, vn12 and vp11 extend in depth up to contact with the ground plane layer gp1 on a N-doped region gp1-$n$. A bias circuit not shown applies bias voltages to the interconnections vp1, vp11, vp12, vn1, vn11 and vn12. A same bias voltage is applied to the interconnections vp1, vp11 and vp12. A same bias voltage is applied to the interconnections vn1, vn11 and vn12. The bias voltage of the interconnection vp1 could be distinct from the bias voltage of the interconnection vn1.

The well layer w1 is separated from the substrate sub by means of a deep n-well dnw. In the example, the deep n-well is biased at a voltage Vdds. The insulation trench 46 extends in depth up to the deep n-well dnw.

The biasing of the ground plane gpp1 is done by the interconnection vp12 by means of the ground plane region gp1-$p$ forming a P-doped semiconducting path. The biasing of the ground plane gpp2 is done by the interconnection vp1 by means of the ground plane region gp1-$n$ forming an N-doped semiconducting path. The biasing of the ground plane gpp2 is done redundantly by the interconnection vp11 by means of the ground plane region gp1-$n$ which furthermore provides for a redundancy of bias of the well layer plumb with the PMOS transistors. The homogeneity of bias of the well layer is thus increased.

The biasing of the ground plane gpn1 is done by the interconnection vn12 by means of the ground plane region gp1-$n$ forming an N-doped semiconducting path. The biasing of the ground plane gpn2 is done by the interconnection vn1 by means of the ground plane region gp1-$p$ forming a P-doped semiconducting path. The biasing of the ground plane gpn2 is done redundantly by the interconnection vn11 by means of the ground plane region gp1-$p$ which furthermore provides for a redundancy of bias of the well layer plumb with the NMOS transistors. The homogeneity of bias of the well layer is thus increased.

As in the case of the other variants, a forward biasing is done of the ground plane by a direct semiconducting path having a same type of doping.

FIGS. 48 to 53 illustrate different variants of standard cells for the repetition cells, intended for the designing of the topology of the integrated circuit 4, as defined in the example of FIGS. 46 and 47.

Figure 48:
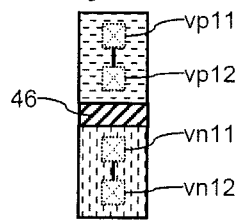
FIGS. 48 to 50 represent different variants of well taps in section at the level of the well.
Figure 51:
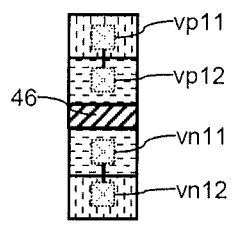
FIGS. 51 to 53 represent different variants of well taps in section at the level of the ground plane.

FIGS. 48 and 51 illustrate a first variant of design of a well tap. FIG. 18 corresponds to the section of this well tap at the level of the well layer. FIG. 51 corresponds to the section of this well tap at the level of the ground plane layer. In this example, the interconnections vp11, vp12 or vn11, vn12 use a common active layer on a gate pitch width (illustrated by the line connecting the interconnections represented in projection). This variant corresponds to the example implemented in FIGS. 46 and 47.

Figure 49:
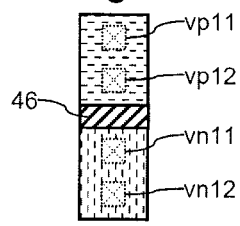
Figure 52:
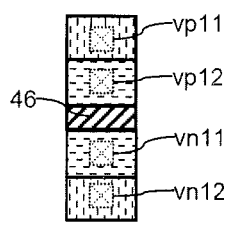

FIGS. 49 and 52 illustrate a second variant of design of a well tap. FIG. 49 corresponds to the section of this well tap at the well layer. FIG. 52 corresponds to the section of this well tap at the ground plane layer. In this example, the interconnections vp11, vp12 or vn11, vn12 use a distinct active layer or region on a gate pitch width.

Figure 50:
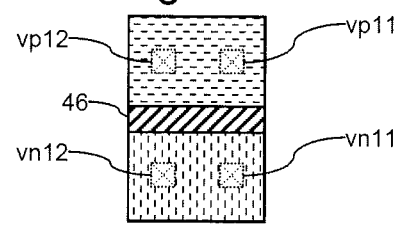
Figure 53:
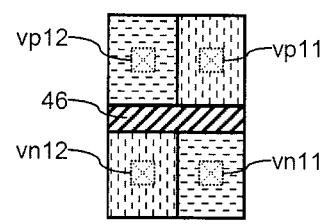

FIGS. 50 and 53 illustrate a third variant of design of a well tap. FIG. 50 corresponds to the section of this well tap at the well layer. FIG. 53 corresponds to the section of this well tap at the ground plane layer. In this example, the interconnections vp11, vp12 or vn11, vn12 use a distinct active layer on twice the gate pitch width.

Figure 54:
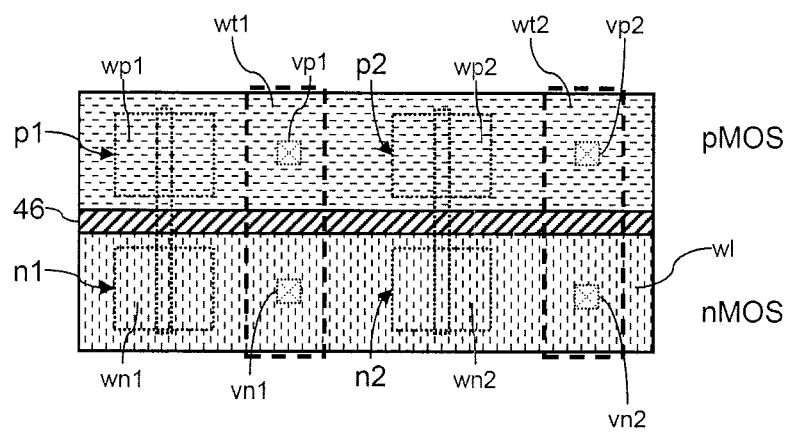
FIGS. 54 and 55 are top views in section of a part of another variant of an integration region, respectively at the level of the wells and the ground planes.
Figure 55:
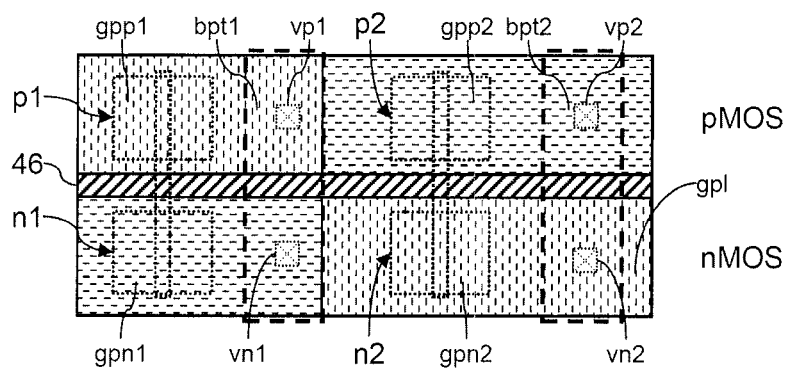

FIGS. 54 and 55 illustrate a modulation of the fourth variant of integrated circuit structure according to the invention, aimed at simplifying its structure. FIGS. 54 and 55 are top views in section at the level of a group of transistors belonging to adjacent rows and/or comprising ground planes for which the dopings are of opposite types. FIG. 54 is a view in section of the structure at its well layer w1. FIG. 55 is a top view in section of the structure at its ground plane layer gp1.

As compared with the variant of FIGS. 46 and 47, the well tap placed between the transistors p1 and p2 comprises simplified structures. This well tap comprises only one interconnection vp1 for the transistor p1 and one interconnection vn1 for the transistor n1. The ground plane region bpt1 placed plumb with the well tap comprises a P-type doping between the transistors p1 and p2, and an N-type doping between the transistors n1 and n2.

The well layer plumb with the PMOS transistors is biased here solely by means of the region bpt2 of the well tap including the interconnection vp1. The well layer plumb with the NMOS transistors is herein biased solely by means of the region bpt2 of the well tap including the interconnection vn1. Although the biasing of the well layer w1 can be less homogenous than in the example of FIGS. 46 and 47, this homogeneity proves to be sufficient while at the same time facilitating the method for manufacturing the integrated circuit.

Having described the invention, and a preferred embodiment thereof, what is claimed as new and secured by Letters Patent is:

1. A manufacture comprising an integrated circuit comprising a stacking of a semiconducting substrate, a buried insulating layer, and a semiconducting layer, a first electronic component formed in and/or on said semiconductor layer, a first portion of a bias circuit electrically connected to first and second via-type interconnections to apply a first bias voltage to said first and second via-type interconnections, a first insulation trench separating said first electronic component from said first and second interconnections in said semiconductor layer, a first ground plane having a first type of doping, placed beneath said buried insulating layer plumb with said first electronic component, and extending beneath said first insulation trench and being in electrical contact with said first interconnection, and a first well having a second type of doping opposite that of said first type, plumb with said first ground plane, and extending beneath said first insulation trench and being in electrical contact with said second interconnection.

2. The manufacture of claim 1, further comprising a second electronic component formed in and/or on said semiconductor layer, and a second ground plane having a second type of doping, plumb with said buried insulating layer, and plumb with said second electronic component, said first well extending up into contact with said second ground plane.

3. The manufacture of claim 2, wherein said first well has a junction with said first type of doping and extends in a same layer as said first and second ground planes up into said second interconnection.

4. The manufacture of claim 2, wherein said first and second electronic components are first and second FDSOI transistors that are at least one of both NMOS and both PMOS.

5. The manufacture of claim 4, wherein said first and second transistors are placed in a same row of transistors, said second ground plane being surrounded by semiconductor having said first type of doping in a layer including said first and second ground planes.

6. The manufacture of claim 4, wherein said first and second transistors are placed in a same row of transistors, said second ground plane extending along said width of said row.

7. The manufacture of claim 4, further comprising an electrical junction connecting said first and second interconnections in said semiconductor layer, said first and second interconnections being made in a same well tap having a width of one gate pitch of said first transistor.

8. The manufacture of claim 4, wherein no electrical junction connects said first and second interconnections in said semiconductor layer, and wherein said first and second interconnections are prepared in a same well tap having a width of one gate pitch of said first transistor.

9. The manufacture of claim 4, wherein no electrical junction connects said first and second interconnections in said semiconductor layer, and wherein said first and second interconnections are made in a same well tap having a width of two gate pitches of said first transistor.

10. The manufacture of claim 6, further comprising a third FDSOI transistor of a type opposite that of said first transistor formed in and/or on said semiconductor layer, a fourth FDSOI transistor of said same type as said third transistor and formed in and/or on said semiconductor layer, a second portion of a bias circuit electrically connected to third and fourth via-type interconnections to apply a second bias voltage to said third and fourth via-type interconnections, at least one second insulation trench separating said third transistor from said third and fourth interconnections in said semiconductor layer, a third ground plane having a third type of doping placed beneath said buried insulating layer plumb with said third transistor, extending beneath said first insulation trench, and being in electrical contact with said third interconnection, a second well having a fourth type of doping opposite said third type, placed plumb with said third ground plane and extending beneath said first insulation trench and being in electrical contact with said fourth interconnection, a fourth ground plane having said fourth type of doping, placed plumb with said buried insulating layer and plumb with fourth transistor, said second well extending up into contact with said fourth ground plane.

11. The manufacture of claim 10, wherein said first and second wells have a same type of doping.

12. The manufacture of claim 1, wherein said first well is separated from said substrate by a deep well made plumb with said first well.

13. The manufacture of claim 1, wherein said substrate has P-type doping.

* * * * *